United States Patent
Ma

(10) Patent No.: US 8,664,992 B2
(45) Date of Patent: Mar. 4, 2014

(54) DUTY CYCLE CONTROLLING CIRCUIT, DUTY CYCLE ADJUSTING CELL, AND DUTYCYCLE DETECTING CIRCUIT

(75) Inventor: Yantao Ma, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 12 days.

(21) Appl. No.: 13/342,217

(22) Filed: Jan. 3, 2012

(65) Prior Publication Data
US 2013/0169330 A1 Jul. 4, 2013

(51) Int. Cl.
*H03K 5/04* (2006.01)
(52) U.S. Cl.
USPC .......................................... 327/175; 327/172

(58) Field of Classification Search
USPC .................................................. 327/172–175
See application file for complete search history.

(56) References Cited

U.S. PATENT DOCUMENTS

| | | | |
|---|---|---|---|
| 7,598,786 B2 * | 10/2009 | Cheng | 327/175 |
| 7,990,194 B2 * | 8/2011 | Shim | 327/158 |
| 8,228,104 B2 * | 7/2012 | Yun et al. | 327/175 |
| 2012/0007647 A1 * | 1/2012 | Shim et al. | 327/175 |

* cited by examiner

*Primary Examiner* — An Luu
(74) *Attorney, Agent, or Firm* — Winston Hsu; Scott Margo

(57) ABSTRACT

A duty cycle controlling circuit for adjusting duty cycle of a target clock signal to a desired value, comprises: a first duty cycle adjusting cell, for receiving a first duty cycle control signal to adjust duty cycle of an input clock signal to generate a first output clock signal as the target clock signal; and a duty cycle detecting module, for generating the first duty cycle control signal according to the first output clock signal.

24 Claims, 7 Drawing Sheets

DUTY CYCLE CONTROLLING CIRCUIT, DUTY CYCLE ADJUSTING CELL, AND DUTYCYCLE DETECTING CIRCUIT

BACKGROUND OF THE INVENTION

1. Field of the Invention

The present invention relates to a duty cycle controlling circuit, a duty cycle adjusting cell and a duty cycle detecting circuit, and particularly relates to a duty cycle controlling circuit that can utilize more than one a duty cycle adjusting cell to provide a clock signal with a precise duty cycle, a duty cycle adjusting cell and a duty cycle detecting circuit

2. Description of the Prior Art

Since the speed requirement of modern electronic device largely increases, DCC (duty cycle controlling) performance becomes more and more important. However, traditional DCC circuits always include some defects. For example, such circuits may have high power consumption, large PSS (power supply sensitivity), DCD (Duty Cycle Distortion) accuracy over PVT issues and longer clock forward path delay. Besides, such circuits have large circuit region, slower locking time and slow duty cycle calculation response/tracking time. Additionally, the trade-off between duty cycle correction accuracy and clock range must be concerned. Also, the accuracy for such circuits is limited by its duty adjuster inverter P/N ratio.

SUMMARY OF THE INVENTION

One objective of the present invention is to provide a duty cycle controlling circuit having smaller circuit region, precise duty cycle controlling and fast locking time.

One embodiment of the present invention discloses a duty cycle controlling circuit, for adjusting duty cycle of a target clock signal to a desired value, comprising: a first duty cycle adjusting cell, for receiving a first duty cycle control signal to adjust duty cycle of an input clock signal to generate a first output clock signal as the target clock signal; and a duty cycle detecting module, for generating the first duty cycle control signal according to the first output clock signal.

Another embodiment of the present invention discloses a duty cycle adjusting cell, comprising: a first inverter, for outputting a first control signal; a second inverter, for outputting a second control signal; a first type-two transistor, having a first terminal coupled to a first predetermined voltage level, having a control terminal for receiving the first control signal, and having a second terminal; a second type-two transistor, having a first terminal coupled to the first predetermined voltage level, having a control terminal for receiving a biasing voltage, and having a second terminal; a first type-one transistor, having a control terminal for receiving the second control signal, having a first terminal and having a second terminal coupled to a second predetermined voltage level; a second type-one transistor, having a control terminal for receiving the biasing voltage, having a first terminal, and having a second terminal coupled to the second predetermined voltage level; and a CMOS, having a control terminal for receiving an input clock signal, and having an output terminal for outputting an output clock signal according to the biasing voltage, the first control signal, the second control signal and the input clock signal, wherein the CMOS has a first terminal coupled to the second terminals of the first type-two transistor and the second type-two transistor, and has a second terminal coupled to the first terminals of the first type-one transistor and the second type-one transistor.

Still another embodiment of the present invention discloses a duty cycle detecting circuit, for generating output voltages according to the duty cycles of a first clock signal and a second clock signal, comprising: a duty cycle difference detecting module, for generating detecting currents according to duty cycle difference between the first clock signal and the second clock signal; and a voltage generating module, for generating the output voltages according to the detecting duty cycle mismatch information.

In view of above-mentioned embodiments, the duty cycle controlling circuit according to the present invention may have the advantage of: wide range duty cycle correction below 10% to beyond 90%, forward path delay reduction, ultra low power saving magnitude, higher accuracy, fast initialization, and smaller circuit region.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
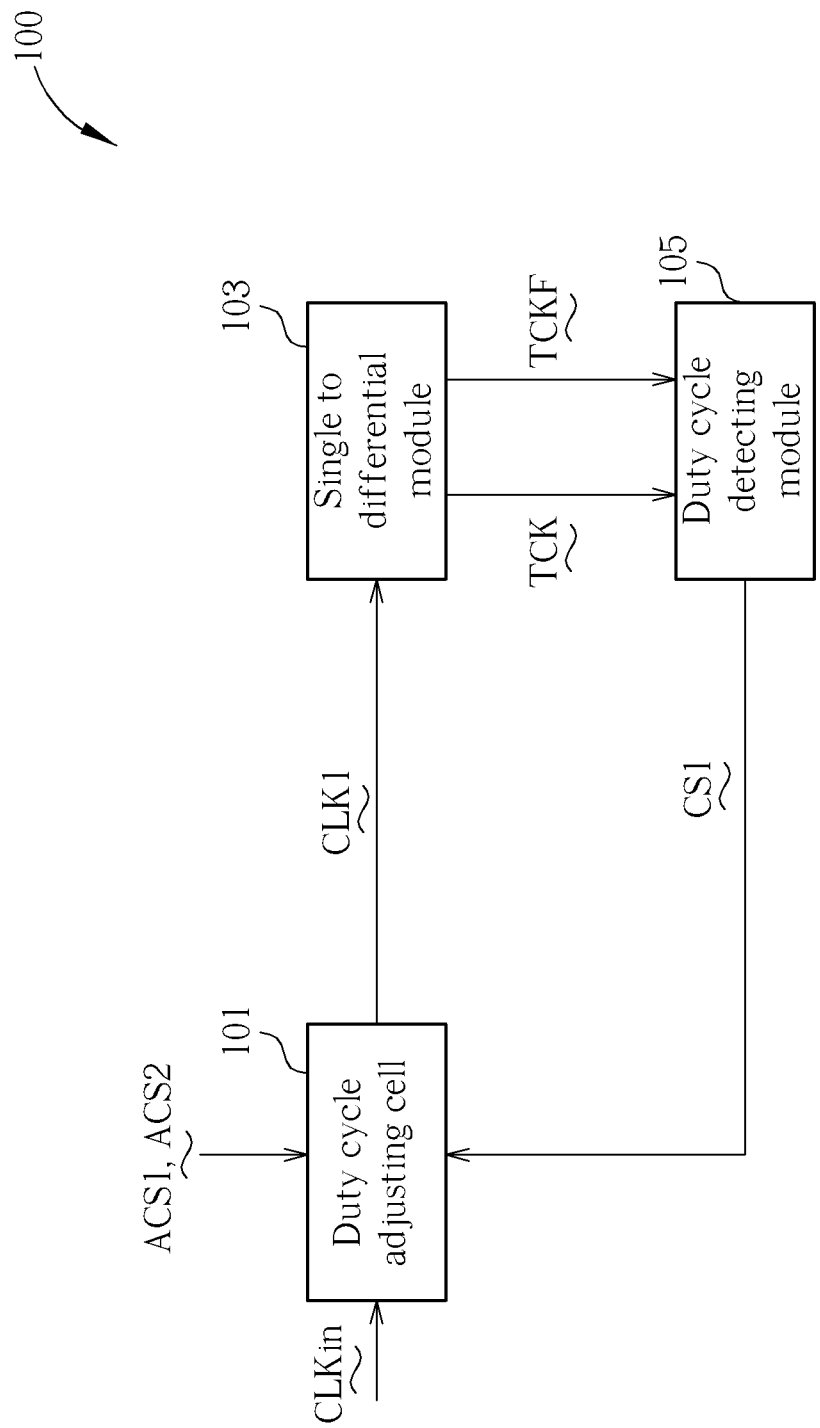
FIGS. 1 and 2 are block diagrams illustrating a duty cycle controlling circuit according to different embodiments of the present invention.
Figure 2:
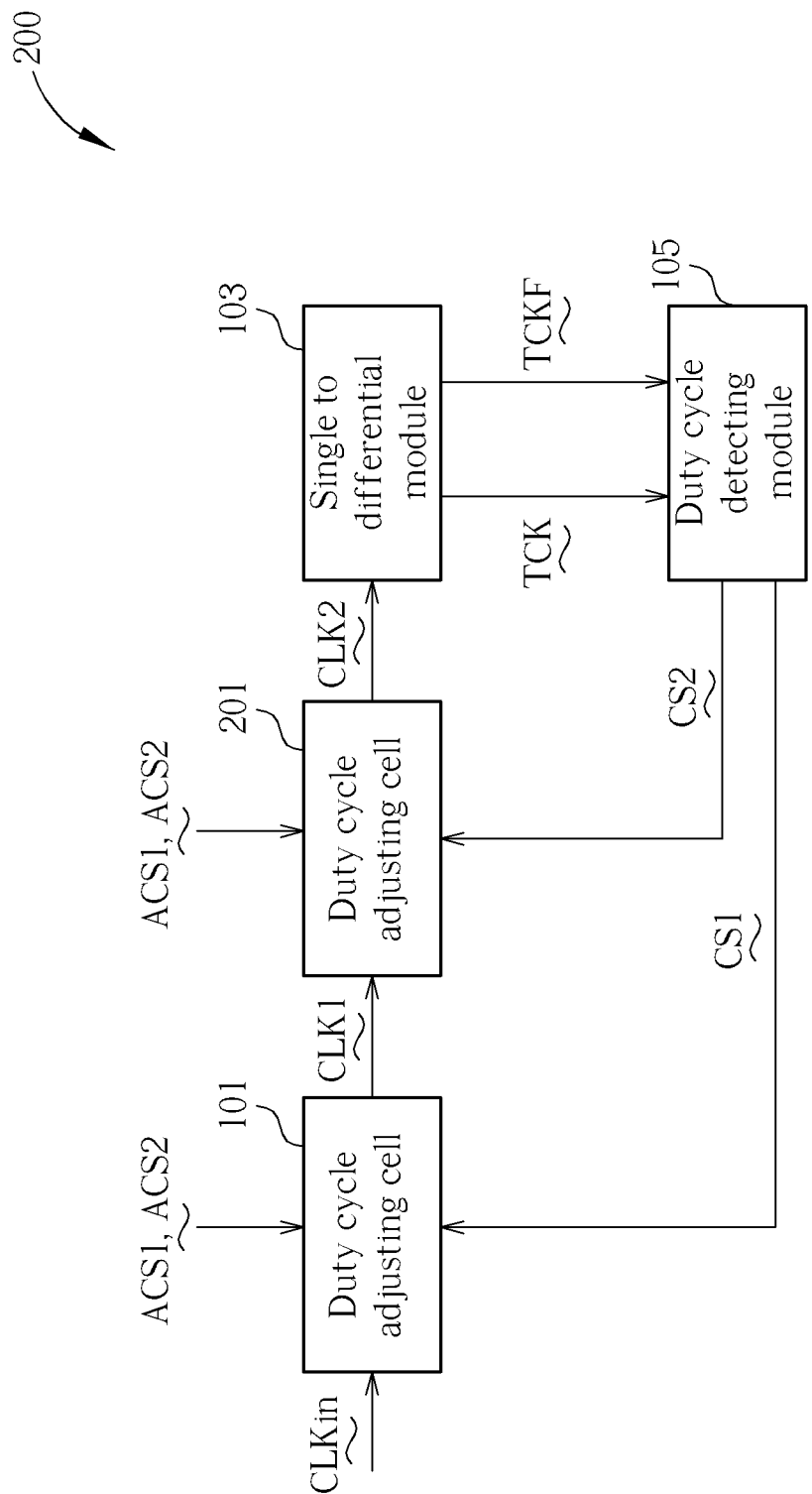

FIGS. 1 and 2 are block diagrams illustrating a duty cycle controlling circuit 100 according to different embodiments of the present invention. In this embodiment, the duty cycle controlling circuit 100 is utilized to adjust the duty cycles of the input signal CLKin to the first output clock signal CLK1. As shown in FIG. 1, the DCC circuit 100 includes a duty cycle adjusting cell 101, a single to differential module 103 and a duty cycle detecting module 105. The duty cycle adjusting cell 101 receives a first duty cycle control signal CS1 to adjust duty cycle of an input clock signal CLKin to generate a first output clock signal CLK1. The single to differential module 103 generates a pair differential clock signals TCK, TCKF according to the first output clock signal CS1. The duty cycle detecting module 105 generates the first duty cycle control signal CS1 according to the differential clock signals TCK and TCKF. The duty cycle adjusting cell 101 can further receive auxiliary control signals ACS1, ACS2, which help control adjusting for the clock signal CLKin's duty cycle.

The embodiment in FIG. 2 discloses a duty cycle controlling circuit 200, which also includes the duty cycle adjusting cell 101, the single to differential module 103 and the duty cycle detecting module 105. The duty cycle controlling circuit 200 further includes a duty cycle adjusting cell 201 located between the duty cycle adjusting cell 101 and the single to differential module 103. The duty cycle adjusting cell 201 receives a second duty cycle control signal CS2 to adjust duty cycle of the first control signal CLK1 to generate a target output clock signal CLK2. Then, the single to differential module 103 generates the differential clock signals TCK and TCKF based on the output clock signal CLK2, and the duty cycle detecting module 105 generates the second duty cycle control signal CS2 according to the differential clocks signal TCK and TCKF. The correction range between the desired duty cycle value of the differential clock signals TCK, TCKF and the duty cycle of the input clock signal CLKin in the embodiment of FIG. 2 can be much larger than which in the embodiment of FIG. 1. Please note the following embodiments utilize the embodiment shown in FIG. 2 for example, that is, the number of duty cycle adjusting cells is two, but it does not mean the number of duty cycle adjusting cells is limited to two, or one. The number of duty cycle adjusting cells can be more than two, depending on the maximal variation range of duty cycle of the input clock signal CLKin. Please note the embodiments shown in FIGS. 1 and 2 both include the single to differential module 103, therefore the structure detecting module 105 corresponds to a differential input. However, the structure detecting module 105 can correspond to single input, thus the single to differential module 103 can be removed from the embodiments shown in FIGS. 1 and 2.

Figure 3:
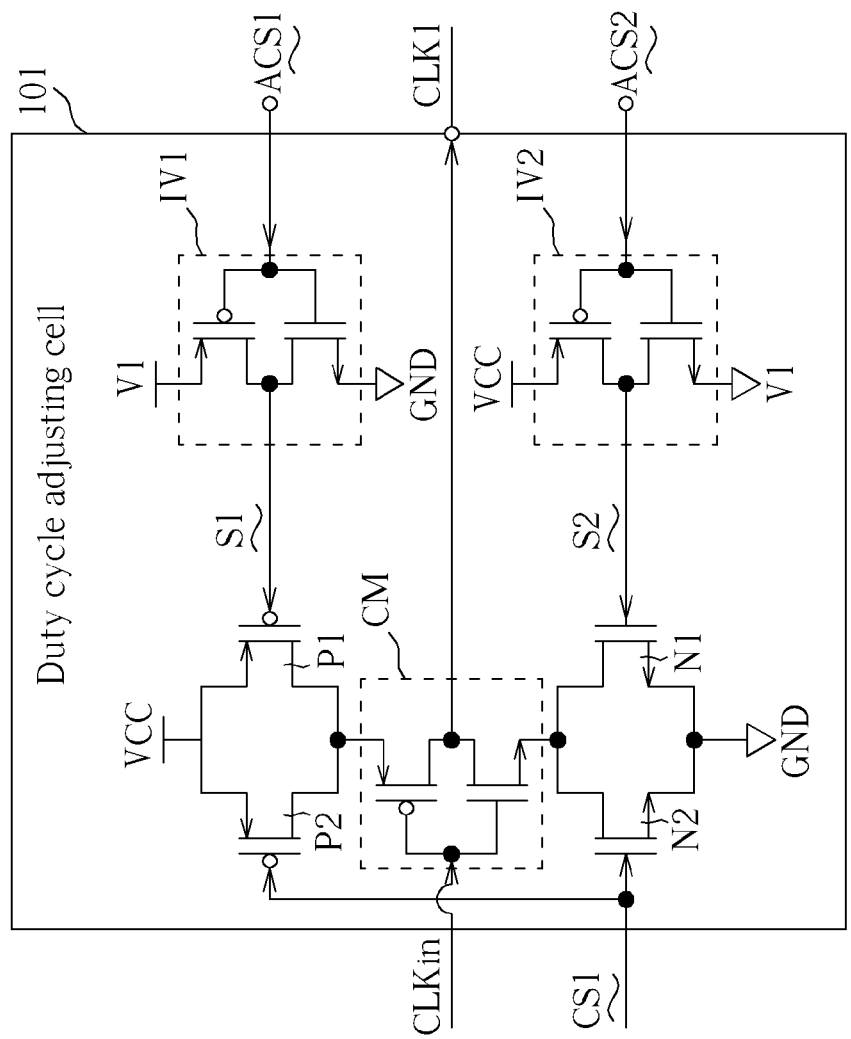
FIG. 3 is a circuit diagram illustrating detail circuits for the duty cycle adjusting cell in FIG. 1, according to one embodiment of the present invention.

FIG. 3 is a circuit diagram illustrating detail circuits for the duty cycle adjusting cell 101 in FIG. 1, according to one embodiment of the present invention. As shown in FIG. 1, the duty cycle adjusting cell 101 includes: a first inverter IV1, a second inverter IV2, a first PMOSFET (i.e. type-two transistor) P1, a second PMOSFET P2, a first NMOSFET (i.e. type-one transistor) N1, a second NMOSFET N2, and a CMOS CM. The first inverter IV1 and the second inverter IV2 respectively output a first control signal S1 and a second control signal S2 to the first PMOSFET P1 and the first NMOSFET N1, according to auxiliary control signals ACS1 and ACS2. ACS1, ACS2 are control signals for weak helper devices (i.e. P1, N2), which can prevent the extreme duty cycle input signal from collapsing during its initialization within a few initial cycles. The first PMOSFET P1 has a source terminal coupled to a first predetermined voltage level Vcc, has a gate terminal for receiving the first control signal S1. The second PMOSFET P2 has a source terminal coupled to the first predetermined voltage level Vcc, and has a gate terminal for receiving the first duty cycle control signal CS1. The duty cycle control signal CS1 serves to provide a biasing voltage to the second PMOSFET P2 and the second NMOSFET N2. The output of the CMOS CM is adjusted either on rising or falling edges depending on the biasing voltage provided to the second PMOSFET P2 and the second NMOSFET N2.

The first NMOSFET N1 has a gate terminal for receiving the second control signal S2, and has a source terminal coupled to aground level GND (i.e. a second predetermined voltage level). The second NMOSFET N2 has a gate terminal for receiving the first duty cycle control signal CS1, and has a source terminal coupled to the ground level GND. The CMOS CM has a control terminal for receiving the input clock signal CLKin, and has an output terminal for outputting the first clock signal CLK1. The CMOS CM further has a first terminal coupled to the drain terminals of the first PMOSFET P1 and the second PMOSFET P2, and has a second terminal coupled to the drain terminals of the first NMOSFET N1 and the second NMOSFET N2. As shown in FIG. 2, the first clock signal CLK1 is generated according to the control signals the first duty cycle control signal CS1, ACS1, ACS2. It can be regarded that the CMOS CM adjusts the duty cycle of the first clock signal CLK1 according to the control signals CS1, ACS1, ACS2 to generate the first clock signal CLK1. Via this structure, infinite resolution for duty cycle adjusting can be performed.

Figure 4:
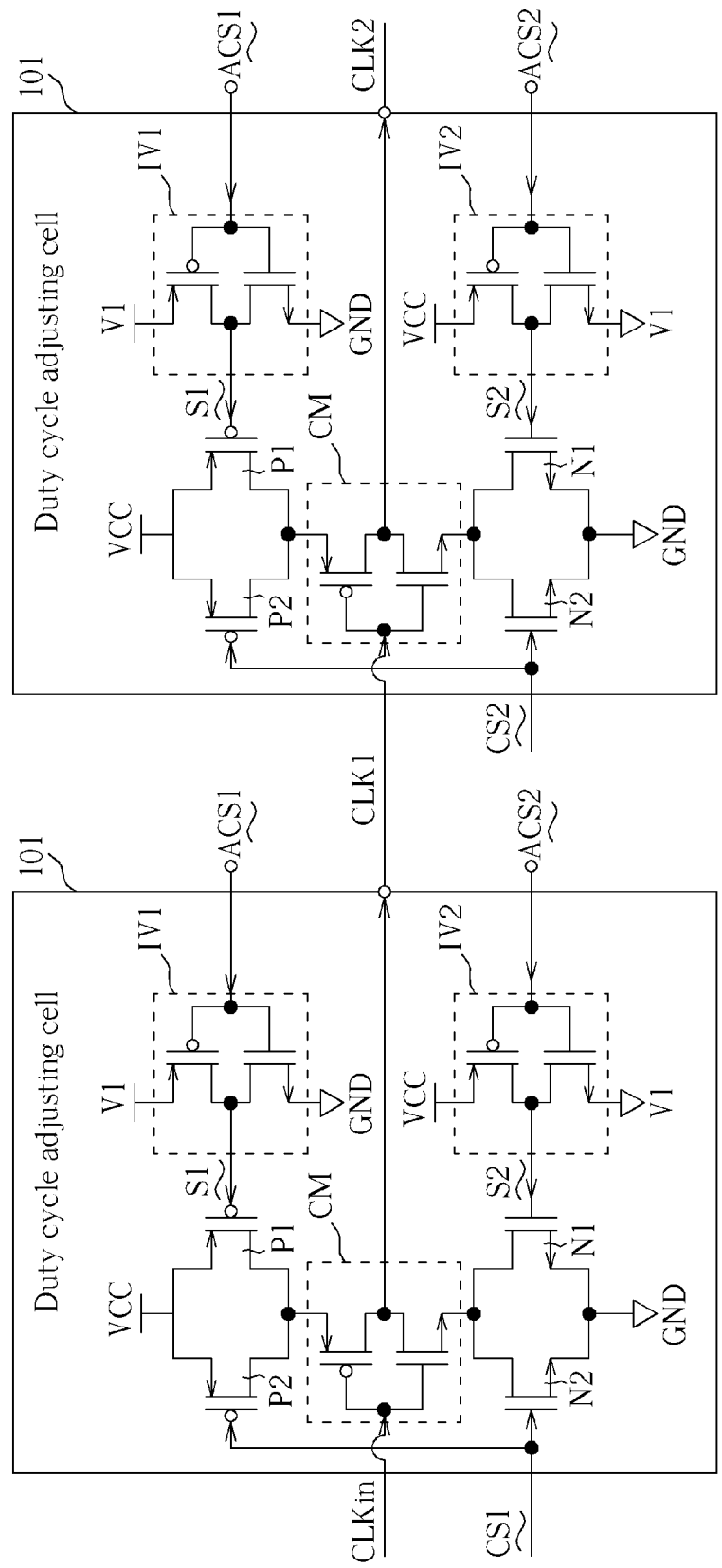
FIG. 4 is a circuit diagram illustrating detail circuits for the duty cycle adjusting cells in FIG. 2, according to one embodiment of the present invention.

FIG. 4 is a circuit diagram illustrating detail circuits for the duty cycle adjusting cells 101, 201 in FIG. 2, according to one embodiment of the present invention. The circuit of the duty cycle adjusting cell 101 is the same as the circuit shown in FIG. 1. The duty cycle adjusting cell 201 also includes the first inverter IV1, the second inverter IV2, the first PMOSFET P1, the second PMOSFET P2, the first NMOSFET N1, the second NMOSFET N2, and the CMOS CM. Basically, 101 and 201 are in serial configuration. The difference between the duty cycle adjusting cells 101, 201 is: the CMOS CM in the duty cycle adjusting cell 201 receives the first clock signal CLK1 to generate the second clock signal CLK2 rather than receives the input clock signal CLKin to generate the first clock signal CLK1; also, the second PMOSFET P2 and the second NMOSFET receives the second duty cycle control signal CS2 rather than the first duty cycle control signal CS1.

Figure 5:
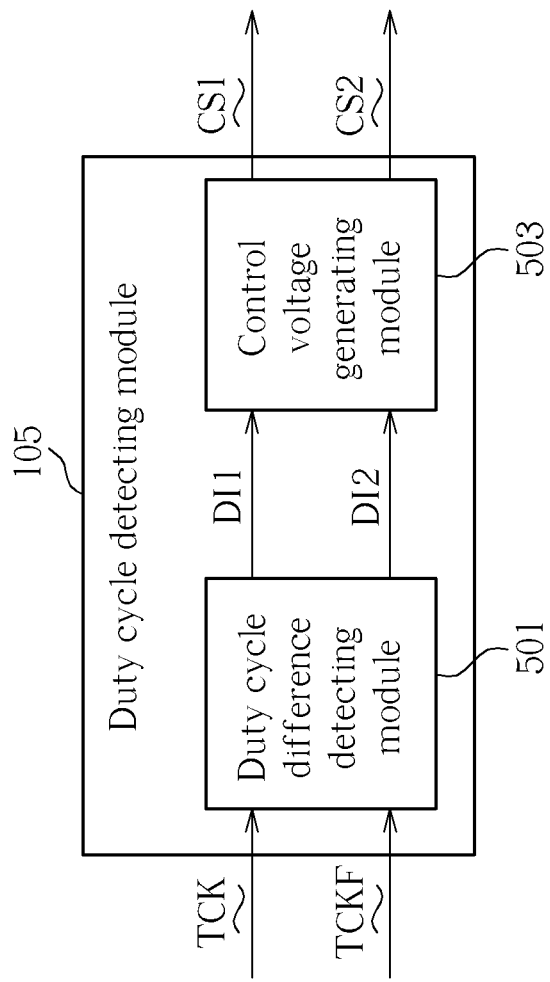
FIG. 5 is a block diagram illustrating the duty cycle detecting module in FIGS. 1 and 2, according to one embodiment of the present invention.

FIG. 5 is a block diagram illustrating the duty cycle detecting module in FIGS. 1 and 2, according to one embodiment of the present invention. As shown in FIG. 5, the duty cycle difference detecting module 105 includes a duty cycle difference detecting module 501 and a control voltage generating module 503. The duty cycle difference detecting module 501 generates detecting currents DI1, DI2 according to duty cycle difference between the differential clock signals TCK, TCKF. The control voltage generating module 503 generates control voltages (i.e. the first, second control signals CS1, CS2) according to the detecting currents DI1, DI2. In one embodiment, the circuit of the duty cycle difference detecting module 501 must makes sure the symmetric balanced trigger points on both rising and falling edges of the first clock signal CLK1 and the second clock signal CLK2 to ensure duty cycle detection accuracy. Also, in one embodiment, the control voltage generating module 503 includes balanced current mirrors to generate control voltages according to the detecting currents DI1, DI2.

Figure 6:
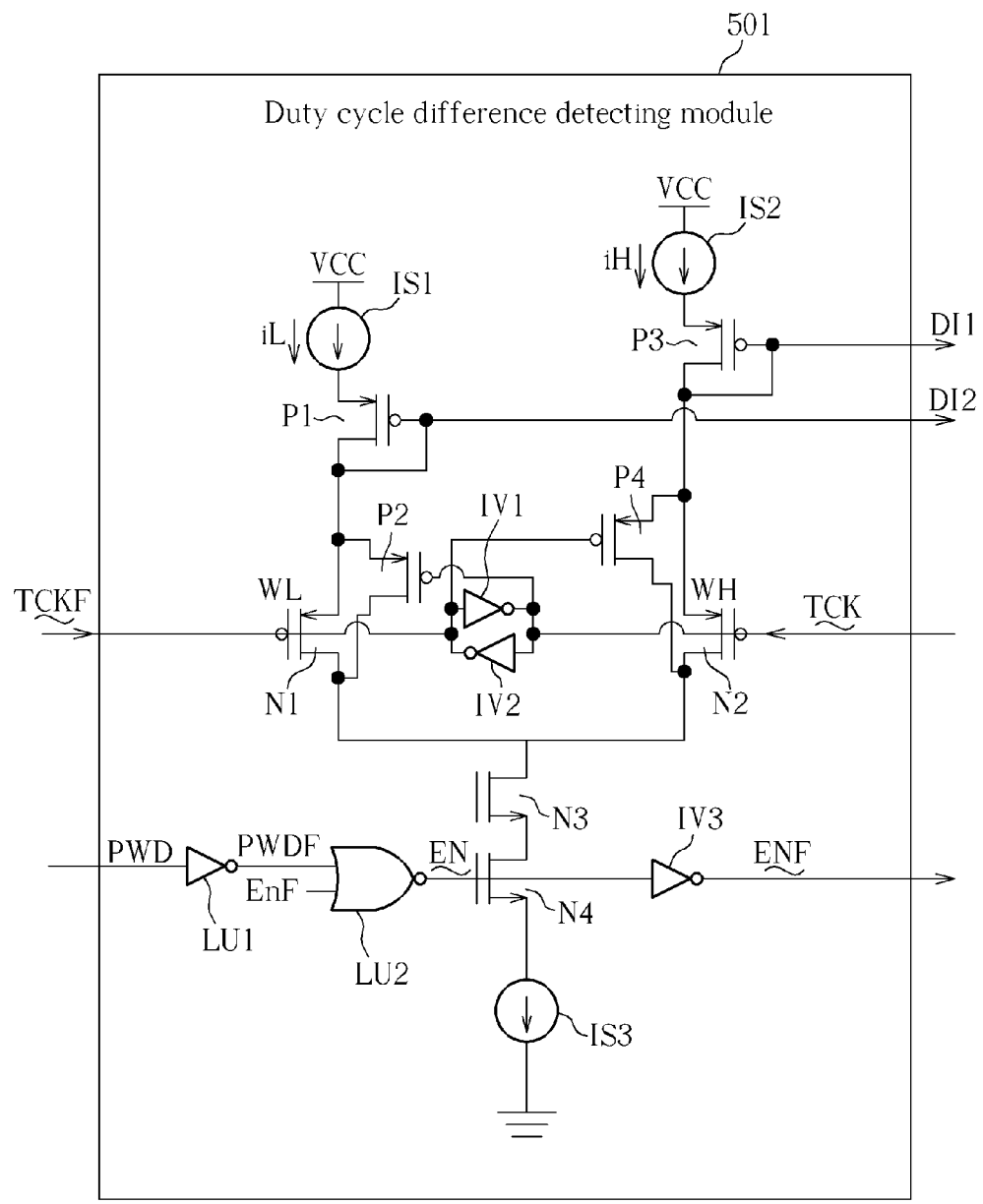
FIG. 6 is a circuit diagram illustrating detail circuits for the duty cycle difference detecting module in FIG. 5, according to one embodiment of the present invention.

FIG. 6 is a circuit diagram illustrating detail circuits for the duty cycle difference detecting module 501 in FIG. 5, according to one embodiment of the present invention. As shown in FIG. 6, the duty cycle difference detecting module 501 includes: first/second/third/fourth PMOSFETs P1-P4, first/second/third/fourth NMOSFETes N1-N4. The first PMOSFET P1 has a source terminal coupled to VCC, and has a gate terminal coupled to the drain terminal. The second PMOSFET P2 has a source terminal coupled to the drain terminal of the first PMOSFET P1. The third PMOSFET P3 has a source terminal coupled to VCC, and has agate terminal coupled to the drain terminal thereof. The fourth PMOSFET P4 has a source terminal coupled to the drain terminal of the third PMOSFET P3.

The first NMOSFET N1 has a drain terminal coupled the source terminal of the first PMOSFET P1 and the source terminal of the second PMOSFET P2, has a gate terminal receiving the second clock signal TCKF, and has a source terminal coupled to the drain terminal of the second PMOSFET P2. The second NMOSFET N2 has a drain terminal coupled the drain terminal of the third PMOSFET P3 and the source terminal of the fourth PMOSFET P4, has a gate terminal receiving the first clock signal TCK, and has a source terminal coupled to the drain terminal of the fourth PMOSFET P4. The first inverter IV1 has an input terminal coupled to the gate terminals of the fourth PMOSFET P4 and the first NMOSFET N1, and has an output terminal coupled to the gate terminal of the second PMOSFET P2 and the gate terminal of the second NMOSFET N2. The second inverter IV2 has an input terminal coupled to the output terminal of the first inverter IV1 and has an output terminal coupled to the input terminal of the first inverter IV1. Basically, P1, P3 are paired devices; Similarly, P2 and P4, N1 and N2, IV1 and IV2 are matched pairs respectively.

The third NMOSFET N3 has a drain terminal coupled to the source terminals of the first NMOSFET N1 and the second NMOSFET N2. The fourth NMOSFET N4 has a drain terminal coupled to the source terminal of the third NMOSFET N3, has a control terminal receiving an enable signal EN for turning on or turning off the duty cycle difference detecting module 501. In this embodiment, the enable signal is generated via several logic units LU1, LU2. LU1 is an inverter receiving a power down signal PWD. LU2 is a NOR gate receiving an inverted power down signal PWDF and an inverted enable signal EnF to generate the enable signal EN. The duty cycle difference detecting module 501 outputs or drains detecting voltages DI1 and DI2 at the control terminals of the first type-two transistor and the second type-two transistor.

Figure 7:
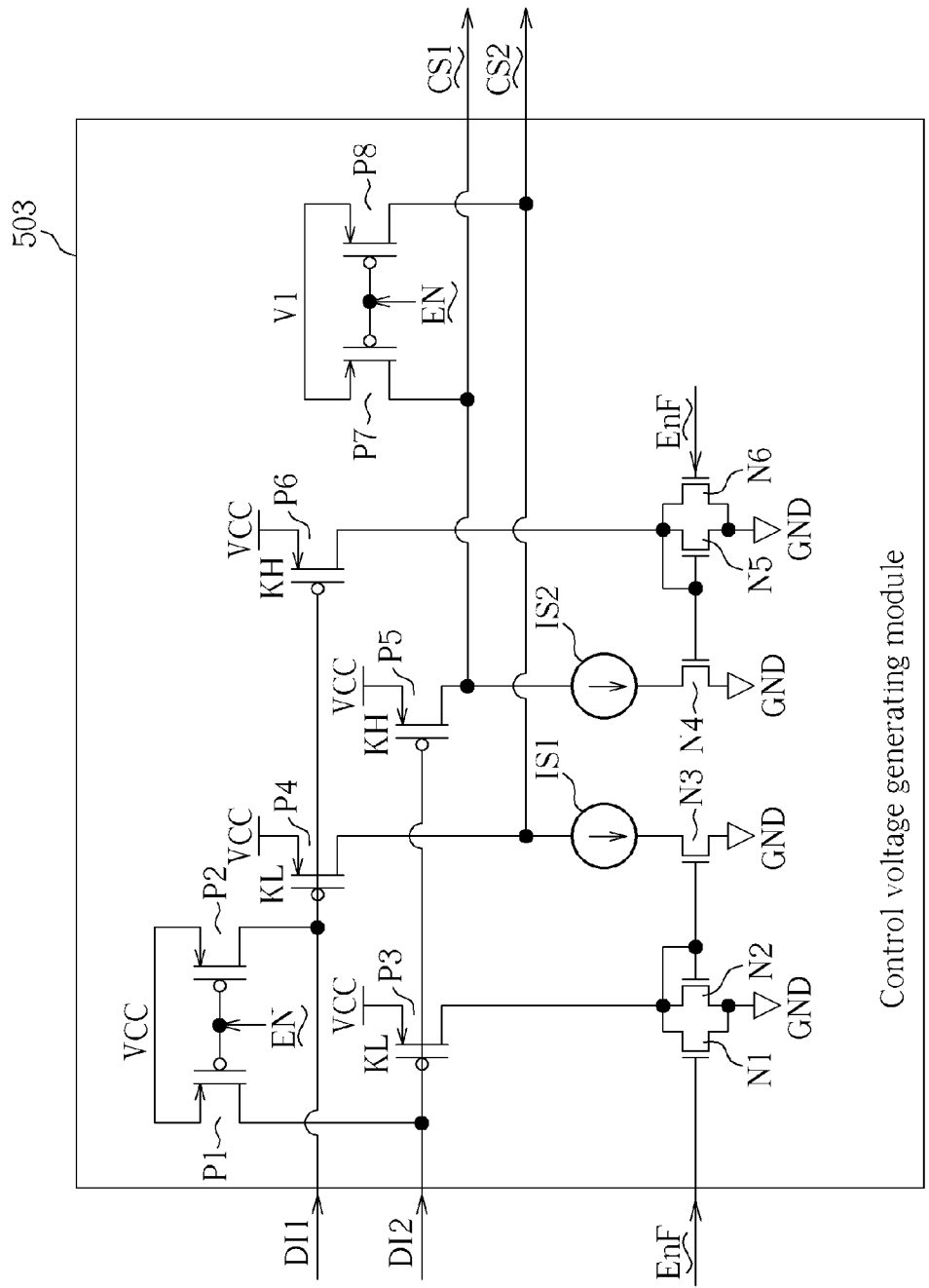
FIG. 7 is a circuit diagram illustrating detail circuits for the control voltage generating module in FIG. 5, according to one embodiment of the present invention.

FIG. 7 is a circuit diagram illustrating detail circuits for the Bias control voltage generating module 503 in FIG. 5, according to one embodiment of the present invention. As shown in FIG. 7, the control voltage generating module 503 includes first-eighth PMOSFETs P1-P8, first-sixth NMOSFETs N1-N6. The fourth PMOSFET P4, P3, and the first-third NMOSFETs N1-N3 form a current mirror. Similarly, The fifth PMOSFET P5, P6, and the fourth-fifth NMOSFETs N4-N6 form another current mirror.

The first PMOSFET P1 and the second PMOS P2 both have a source terminal coupled to a first predetermined voltage level VCC, and has a gate terminal receiving the enable signal EN. The third PMOSFET P3 has a source terminal coupled to the first predetermined voltage level Vcc, and has a gate terminal coupled to the drain terminal of the first PMOSFET P1 and receiving the second detecting voltage DI2.

The fourth PMOSFET P4 has a source terminal coupled to the first predetermined voltage level Vcc, has a gate terminal coupled to the drain terminal of the second PMOSFET P2 and receiving the first detecting voltage DI1. The fifth PMOSFET P5 has a source terminal coupled to the first predetermined voltage level Vcc, and has a gate terminal coupled to the drain terminal of the first PMOSFET P1 and receiving the second detecting voltage ID2. The sixth PMOSFET P6 has a source terminal coupled to the first predetermined voltage level Vcc, and has a gate terminal coupled to the drain terminal of the second PMOSFET P2 and receiving the first detecting voltage DI1. The seventh PMOSFET P7 and eighth PMOSFET P8 both have a source terminal coupled to a second predetermined voltage level V1, has a gate terminal receiving the enable signal EN. The drain terminal of the seventh PMOSFET P7 is coupled to the drain terminal of the fifth PMOSFET P5. The drain terminal of the eighth PMOSFET P8 is coupled to the drain terminal of the fourth PMOSFET P4.

The first, second NMOSFET N1, N2 both have a drain terminal coupled to a drain terminal of the third PMOSFET and a source terminal coupled to a third predetermined voltage level (ground level in this embodiment). The gate terminal of the first NMOSFET N1 receives ENF, which is an inverted signal for the enable signal EN. Also, the gate terminals and the drain terminals of the second NMOSFET N2 are coupled. The third NMOSFET N3 has a drain terminal, has a gate terminal coupled to the gate terminal of the second NMOSFET N2, and has a source terminal coupled to the third predetermined voltage level GND. The fourth NMOSFET N4 has a drain terminal coupled to the gate terminal of the fifth NMOSFET N5, and has a source terminal coupled to the third predetermined voltage level GND. The structures of the fifth, sixth NMOSFETs N5, N6 are the similar as which of the first, second NMOSFETs N1, N2, thus are omitted for brevity here. Also, the structures of the seventh, eighth PMOSFETs P7, P8 are the similar as which of the first, second PMOSFETs P1, P2, but please note that the source terminals of the seventh, eighth PMOSFETs P7, P8 are coupled to the second predetermined voltage level V1 rather than the first predetermined voltage Vcc. The control voltage generating module 503 outputs the output voltages (i.e. the control signals CS1, CS2) at the drain terminals of the fifth PMOSFET P5 and the fourth PMOSFET P4.

The advantages of the circuits shown in FIG. 6 and FIG. 7 are described as follows. In FIG. 6, the channel width of the first NMOSFER N1 is assumed to be $W_L$, the channel width of the second NMOSFER N2 is assumed to be $W_H$, the current provided by the first current source IS1 is $i_L$ and the current provided by the second current source IS1 is $i_H$. Besides, in FIG. 7, K is the size ratio between current mirror (P3~P6) to P1 or P3. K values for the third and fourth PMOSFETs are supposed to be $K_L$, and the K values for the fifth and sixth PMOSFETs are supposed to be $K_H$.

The voltage levels of the controls signals CS1 and CS2 can computed based on following equations (1) and (2).

The high or low pulse width ration $t_{H/L}$ for output clock signals TCK, $$TCKF \propto \frac{i_{H/L}}{W_{H/L}}$$

$$V_{CS1} \propto \int (K_H \cdot i_L - K_H \cdot i_H) \cdot dt = \int K_H \cdot (i_L - i_H) \cdot dt \propto \int K_H \cdot (W_L \cdot t_L - W_H \cdot t_H) \cdot dt \qquad \text{Eq (1)}$$

$$V_{CS2} \propto \int (K_L \cdot i_H - K_L \cdot i_L) \cdot dt = \int K_L \cdot (i_H - i_L) \cdot dt \propto \int K_L \cdot (W_H \cdot t_H - W_L \cdot t_L) \cdot dt \qquad \text{Eq (2)}$$

Therefore, the circuits shown in FIGS. 6 and 7 can have symmetrical H/L duty sensing.

Besides, if WL and WH are assumed to be W and the integration symbols are ignored, following equations (3) and (4) can be acquired.

$$V_{CS1} \propto K_H \cdot (W_L \cdot t_L - W_H \cdot t_H) = K_H \cdot W \cdot (t_L - t_H) = K'_H \cdot \Delta t_{L-H} \qquad \text{Eq (3)}$$

$$V_{CS2} \propto K_L \cdot (W_H \cdot t_H - W_L \cdot t_L) = K_L \cdot W \cdot (t_H - t_L) = -K'_L \cdot \Delta t_{L-H} \qquad \text{Eq (4)}$$

Therefore, the circuits shown in FIGs and 7 can have linear real time-to-voltage decision.

Additionally, duty cycle distortion $$\Delta DCD = |\Delta t_H - \Delta t_L| = \frac{|\Delta t_{L-H}|}{2},$$

thus the following equations (5) and (6) can be acquired.

$$V_{CS1} \propto K'_H \cdot \Delta t_{L-H} = 2K'_H \cdot \Delta DCD \qquad \text{Eq (5)}$$

$$V_{CS2} \propto -K'_L \cdot \Delta t_{L-H} = -2K'_L \cdot \Delta DCD \qquad \text{Eq (6)}$$

Accordingly, the duty cycle detecting sensitivity of the circuits shown in FIG. 6 and FIG. 7 can be determined by three parameters: $K_H$, $K_L$ and W, based upon above-mentioned equations (1)-(6).

By swapping locations of P4 and P5, It is easy to achieve output duty cycle static offset. In view of above-mentioned embodiments, the "time of output high" (i.e. the time for high level of the clock signals TCK or TCKF can be determined by following three factors: the PMOSFET, NMOSFET size for the inverters IV1, IV2 in FIG. 3; parameters WH, WL; the sizes difference between the fourth PMOSFET P4 and the fifth PMOSFET P5 in FIG. 7. The equations (7) and (8) can be further acquired.

$$V_{CS1} \propto \int (K_L \cdot i_L - K_H \cdot i_H) \cdot dt = \int (K_L \cdot W_L \cdot t_L - K_H \cdot W_H \cdot t_H) \cdot dt \qquad \text{Eq (7)}$$

$$V_{CS2} \propto \int (K_H \cdot i_H - K_L \cdot i_L) \cdot dt = -\int (K_L \cdot W_L \cdot t_L - K_H \cdot W_H \cdot t_H) \cdot dt \qquad \text{Eq (8)}$$

Therefore, if $K_L \cdot W_L \cdot t_L - K_H \cdot W_H \cdot t_H = 0$, then the static offset duty cycle adjusting can be achieved.

In view of above-mentioned embodiments, the duty cycle controlling circuit according to the present invention may have the advantage of: wide range duty cycle correction below 10% to beyond 90%, forward path delay reduction, ultra low power saving magnitude, higher accuracy, fast initialization, and smaller circuit region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A duty cycle controlling circuit, for adjusting duty cycle of a target clock signal to a desired value, comprising:
    a first duty cycle adjusting cell, for receiving a first duty cycle control signal to adjust duty cycle of an input clock signal to generate a first output clock signal as the target clock signal;
    a single to differential module, for generating a target differential clock signal as the target clock signal according to the first output clock signal; and
    a duty cycle detecting module, for generating the first duty cycle control signal according to the first output clock signal, comprising:
        a duty cycle difference detecting module, for generating detecting currents according to duty cycle difference between the target differential clock signal; and
        a voltage generating module, for generating the first duty control signal and the second duty control signal according to the detecting currents.

2. The duty cycle controlling circuit of claim 1, further comprising extra duty cycle adjusting cells besides the first duty cycle adjusting cell, wherein the duty cycle detecting module further generates other duty cycle control signals besides the first duty cycle control signal according to the output from the extra duty cycle adjusting cells; wherein a number of the extra duty cycle adjusting cells depends on the difference between the desired value and the duty cycle of the input clock signal.

3. The duty cycle controlling circuit of claim 1, wherein the first duty cycle adjusting cell comprises:
    a first inverter, for outputting a first control signal;
    a second inverter, for outputting a second control signal;
    a first type-two transistor, having a first terminal coupled to a first predetermined voltage level, having a control terminal for receiving the first control signal, and having a second terminal;
    a second type-two transistor, having a first terminal coupled to the first predetermined voltage level, having a control terminal for receiving the first duty control signal, and having a second terminal;
    a first type-one transistor, having a control terminal for receiving the second control signal, having a first terminal and having a second terminal coupled to a second predetermined voltage level;
    a second type-one transistor, having a control terminal for receiving the first duty control signal, having a first terminal, and having a second terminal coupled to the second predetermined voltage level; and
    a CMOS, having a control terminal for receiving an input clock signal, and having an output terminal for outputting the first output clock signal according to the first duty control signal, the first control signal, the second control signal and the input clock signal, wherein the CMOS has a first terminal coupled to the second terminals of the first type-two transistor and the second type-two transistor, and has a second terminal coupled to the first terminals of the first type-one transistor and the second type-one transistor.

4. The duty cycle adjusting cell of claim 3, wherein the first inverter is between the third predetermined voltage level and the second predetermined voltage level, and the second inverter is between the first predetermined voltage level and the third predetermined voltage level.

5. The duty cycle adjusting cell of claim 3, wherein the first inverter receives an auxiliary signal to generate the first control signal, and the second inverter receives an inversed signal of the auxiliary signal to generate the second control signal.

6. The duty cycle detecting circuit of claim 1, the circuit of the duty cycle difference detecting module must make sure symmetric balanced trigger points on both rising and falling edges of the target differential clock signal.

7. The duty cycle detecting circuit of claim 1, the voltage generating module includes balanced current mirrors to generate the first duty control signal and the second duty control signal according to the detecting currents.

8. The duty cycle detecting circuit of claim 1, wherein the duty cycle difference detecting module comprises:
    a first type-two transistor, having a first terminal and a second terminal, and having a control terminal coupled to the second terminal;
    a second type-two transistor, having a first terminal coupled to the second terminal of the first type-two transistor, and having a control terminal and a second terminal;
    a third type-two transistor, having a first terminal and a second terminal, and having a control terminal coupled to the second terminal of the third type-two transistor;
    a fourth type-two transistor, having a first terminal coupled to the second terminal of the third type-two transistor, and having a control terminal and a second terminal;
    a first type-one transistor, having a first terminal coupled the second terminal of the first type-two transistor and the first terminal of the second type-two transistor, having a control terminal receiving the target differential clock signal, and having a second terminal coupled to the second terminal of the second type-two transistor;
a second type-one transistor, having a first terminal coupled the second terminal of the third type-two transistor and the first terminal of the fourth type-two transistor, having a control terminal receiving the target differential clock signal, and having a second terminal coupled to the second terminal of the fourth type-two transistor;
a first inverter, having an input terminal coupled to the control terminal of the fourth type-two transistor and the control terminal of the first type-one transistor, and having an output terminal coupled to the control terminal of the second type-two transistor and the control terminal of the second type-one transistor;
a second inverter, having an input terminal coupled to the output terminal of the first inverter, and having an output terminal coupled to the input terminal of the first inverter;
a third type-one transistor, having a first terminal coupled to the second terminals of the first type-one transistor and the second type-one transistor;
a fourth type-one transistor, having a first terminal coupled to the second terminals of the third type-one transistor, having a control terminal receiving an enable signal for turning on or turning off the duty cycle difference detecting module, and having a second terminal; and
wherein the duty cycle difference detecting module outputting detecting currents at the control terminals of the first type-two transistor and the second type-two transistor.

9. The duty cycle detecting module of claim 1, wherein the detecting currents comprise a first detecting current and a second detecting current, where the duty cycle difference detecting module receives an enable signal to turn on or turn off the duty cycle difference detecting module, wherein the voltage generating module comprises:
a first type-two transistor, having a first terminal coupled to a first predetermined voltage level, having a control terminal receiving the enable signal, and having a second terminal;
a second type-two transistor, having a first terminal coupled to the first predetermined voltage level, having a control terminal receiving the enable signal, and having a second terminal;
a third type-two transistor, having a first terminal coupled to the first predetermined voltage level, having a control terminal coupled to the second terminal of the first type-two transistor and receiving the second detecting current, and having a second terminal;
a fourth type-two transistor, having a first terminal coupled to the first predetermined voltage level, having a control terminal coupled to the second terminal of the second type-two transistor and receiving the first detecting current, and having a second terminal;
a fifth type-two transistor, having a first terminal coupled to the first predetermined voltage level, having a control terminal coupled to the second terminal of the first type-two transistor and receiving the second detecting current, and having a second terminal;
a sixth type-two transistor, having a first terminal coupled to the first predetermined voltage level, having a control terminal coupled to the second terminal of the second type-two transistor and receiving the first detecting current, and having a second terminal;
a seventh type-two transistor, having a first terminal coupled to a second predetermined voltage level, having a control terminal receiving the enable signal, and having a second terminal coupled to the second terminal of the fifth type-two transistor;
a eighth type-two transistor, having a first terminal coupled to the second predetermined voltage level, having a control terminal receiving the enable signal, and having a second terminal coupled to the second terminal of the fourth type-two transistor;
a first type-one transistor, having a first terminal coupled to a second terminal of the third type-two transistor, having a control terminal receiving an inversed signal of the enable signal, and having a second terminal coupled to a third predetermined voltage level;
a second type-one transistor, having a first terminal coupled to the first terminal of the first type-one transistor, having a control terminal coupled to the first terminals of the first type-one transistor and the second type-one transistor, and the first terminal of the second type-one transistor, and having a second terminal coupled to the third predetermined voltage level;
a third type-one transistor, having a first terminal having a control terminal coupled to the control terminal of the second type-one transistor, and having a second terminal coupled to the third predetermined voltage level;
a fourth type-one transistor, having a first terminal and a control terminal, and having a second terminal coupled to the third predetermined voltage level;
a fifth type-one transistor, having a first terminal coupled to the second terminal of the sixth type-two transistor, having a control terminal coupled to the control terminal of the fourth type-one transistor and the first terminal of the fifth type-one transistor, and having a second terminal coupled to the third predetermined voltage level; and
a sixth type-one transistor, having a first terminal coupled to the first terminal of the fifth type-one transistor, having a control terminal receiving the inversed signal of the enable signal, and having a second terminal coupled to the third predetermined voltage level;
wherein the voltage generating module outputs the first duty control signal and the second duty control signal at the second terminals of the fifth type-two transistor and the fourth type-two transistor.

10. A duty cycle adjusting cell, comprising:
a first inverter, for outputting a first control signal;
a second inverter, for outputting a second control signal;
a first type-two transistor, having a first terminal coupled to a first predetermined voltage level, having a control terminal for receiving the first control signal, and having a second terminal;
a second type-two transistor, having a first terminal coupled to the first predetermined voltage level, having a control terminal for receiving a biasing voltage, and having a second terminal;
a first type-one transistor, having a control terminal for receiving the second control signal, having a first terminal and having a second terminal coupled to a second predetermined voltage level;
a second type-one transistor, having a control terminal for receiving the biasing voltage, having a first terminal, and having a second terminal coupled to the second predetermined voltage level; and)
a CMOS, having a control terminal for receiving an input clock signal, and having an output terminal for outputting an output clock signal according to the biasing voltage, the first control signal, the second control signal and the input clock signal, wherein the CMOS has a first terminal coupled to the second terminals of the first type-two transistor and the second type-two transistor, and has a second terminal coupled to the first terminals of the first type-one transistor and the second type-one transistor.

11. The duty cycle adjusting cell of claim 10, wherein the first inverter is between the third predetermined voltage level and the second predetermined voltage level, and the second inverter is between the first predetermined voltage level and the third predetermined voltage level.

12. The duty cycle adjusting cell of claim 10, wherein the first inverter receives an auxiliary signal to generate the first control signal, and the second inverter receives an inversed signal of the auxiliary signal to generate the second) control signal.

13. A duty cycle detecting circuit, for generating output voltages according to the duty cycles of a first clock signal and a second clock signal, comprising:
   a duty cycle difference detecting module, for generating detecting currents according to duty cycle difference between the first clock signal and the second clock signal; and
   a voltage generating module, for generating the output voltages according to the detecting currents;
   wherein the circuit of the duty cycle difference detecting module must make sure symmetric balanced trigger points on both rising and falling edges of the first clock signal and the second clock signal.

14. The duty cycle detecting circuit of claim 13, the voltage generating module includes balanced current mirrors to generate the output voltages according to the detecting currents.

15. The duty cycle detecting circuit of claim 13, wherein the duty cycle difference detecting module comprises:
   a first type-two transistor, having a first terminal and a second terminal, and having a control terminal coupled to the second terminal;
   a second type-two transistor, having a first terminal coupled to the second terminal of the first type-two transistor, and having a control terminal and a second terminal;
   a third type-two transistor, having a first terminal and a second terminal, and having a control terminal coupled to the second terminal of the third type-two transistor;
   a fourth type-two transistor, having a first terminal coupled to the second terminal of the third type-two transistor, and having a control terminal and a second terminal;
   a first type-one transistor, having a first terminal coupled the second terminal of the first type-two transistor and the first terminal of the second type-two transistor, having a control terminal receiving the second clock signal, and having a second terminal coupled to the second terminal of the second type-two transistor;
   a second type-one transistor, having a first terminal coupled the second terminal of the third type-two transistor and the first terminal of the fourth type-two transistor, having a control terminal receiving the first clock signal, and having a second terminal coupled to the second terminal of the fourth type-two transistor;
   a first inverter, having an input terminal coupled to the control terminal of the fourth type-two transistor and the control terminal of the first type-one transistor, and having an output terminal coupled to the control terminal of the second type-two transistor and the control terminal of the second type-one transistor;
   a second inverter, having an input terminal coupled to the output terminal of the first inverter, and having an output terminal coupled to the input terminal of the first inverter;
   a third type-one transistor, having a first terminal coupled to the second terminals of the first type-one transistor and the second type-one transistor;
   a fourth type-one transistor, having a first terminal coupled to the second terminals of the third type-one transistor, having a control terminal receiving an enable signal for turning on or turning off the duty cycle difference detecting module, and having a second terminal; and
   wherein the duty cycle difference detecting module outputting detecting currents at the control terminals of the first type-two transistor and the second type-two transistor.

16. The duty cycle detecting module of claim 13, wherein the detecting currents comprise a first detecting current and a second detecting current, where the duty cycle difference detecting module receives an enable signal to turn on or turn off the duty cycle difference detecting module, wherein the voltage generating module comprises:
   a first type-two transistor, having a first terminal coupled to a first predetermined voltage level, having a control terminal receiving the enable signal, and having a second terminal;
   a second type-two transistor, having a first terminal coupled to the first predetermined voltage level, having a control terminal receiving the enable signal, and having a second terminal;
   a third type-two transistor, having a first terminal coupled to the first predetermined voltage level, having a control terminal coupled to the second terminal of the first type-two transistor and receiving the second detecting current, and having a second terminal;
   a fourth type-two transistor, having a first terminal coupled to the first predetermined voltage level, having a control terminal coupled to the second terminal of the second type-two transistor and receiving the first detecting current, and having a second terminal;
   a fifth type-two transistor, having a first terminal coupled to the first predetermined voltage level, having a control terminal coupled to the second terminal of the first type-two transistor and receiving the second detecting current, and having a second terminal;
   a sixth type-two transistor, having a first terminal coupled to the first predetermined voltage level, having a control terminal coupled to the second terminal of the second type-two transistor and receiving the first detecting current, and having a second terminal;
   a seventh type-two transistor, having a first terminal coupled to a second predetermined voltage level, having a control terminal receiving the enable signal, and having a second terminal coupled to the second terminal of the fifth type-two transistor;
   a eighth type-two transistor, having a first terminal coupled to the second predetermined voltage level, having a control terminal receiving the enable signal, and having a second terminal coupled to the second terminal of the fourth type-two transistor;
   a first type-one transistor, having a first terminal coupled to a second terminal of the third type-two transistor, having a control terminal receiving an inversed signal of the enable signal, and having a second terminal coupled to a third predetermined voltage level;
   a second type-one transistor, having a first terminal coupled to the first terminal of the first type-one transistor, having a control terminal coupled to the first terminals of the first type-one transistor and the second type-one transistor, and the first terminal of the second type-one transistor, and having a second terminal coupled to the third predetermined voltage level;

a third type-one transistor, having a first terminal, having a control terminal coupled to the control terminal of the second type-one transistor, and having a second terminal coupled to the third predetermined voltage level;

a fourth type-one transistor, having a first terminal and a control terminal, and having a second terminal coupled to the third predetermined voltage level;

a fifth type-one transistor, having a first terminal coupled to the second terminal of the sixth type-two transistor, having a control terminal coupled to the control terminal of the fourth type-one transistor and the first terminal of the fifth type-one transistor, and having a second terminal coupled to the third predetermined voltage level; and a sixth type-one transistor, having a first terminal coupled to the first terminal of the fifth type-one transistor, having a control terminal receiving the inversed signal of the enable signal, and having a second terminal coupled to the third predetermined voltage level;

wherein the voltage generating module outputs the output voltages at the second terminals of the fifth type-two transistor and the fourth type-two transistor.

17. A duty cycle controlling circuit, for adjusting duty cycle of a target clock signal to a desired value, comprising:
a first duty cycle adjusting cell, for receiving a first duty cycle control signal to adjust duty cycle of an input clock signal to generate a first output clock signal as the target clock signal;
a duty cycle detecting module, for generating the first duty cycle control signal according to the first output clock signal;
wherein the first duty cycle adjusting cell comprises:
a first inverter, for outputting a first control signal;
a second inverter, for outputting a second control signal;
a first type-two transistor, having a first terminal coupled to a first predetermined voltage level, having a control terminal for receiving the first control signal, and having a second terminal;
a second type-two transistor, having a first terminal coupled to the first predetermined voltage level, having a control terminal for receiving the first duty control signal, and having a second terminal;
a first type-one transistor, having a control terminal for receiving the second control signal, having a first terminal and having a second terminal coupled to a second predetermined voltage level;
a second type-one transistor, having a control terminal for receiving the first duty control signal, having a first terminal, and having a second terminal coupled to the second predetermined voltage level; and
a CMOS, having a control terminal for receiving an input clock signal, and having an output terminal for outputting the first output clock signal according to the first duty control signal, the first control signal, the second control signal and the input clock signal, wherein the CMOS has a first terminal coupled to the second terminals of the first type-two transistor and the second type-two transistor, and has a second terminal coupled to the first terminals of the first type-one transistor and the second type-one transistor.

18. The duty cycle adjusting cell of claim 17, wherein the first inverter is between the third predetermined voltage level and the second predetermined voltage level, and the second inverter is between the first predetermined voltage level and the third predetermined voltage level.

19. The duty cycle adjusting cell of claim 17, wherein the first inverter receives an auxiliary signal to generate the first control signal, and the second inverter receives an inversed signal of the auxiliary signal to generate the second control signal.

20. A duty cycle controlling circuit, for adjusting duty cycle of a target clock signal to a desired value, comprising:
a first duty cycle adjusting cell, for receiving a first duty cycle control signal to adjust duty cycle of an input clock signal to generate a first output clock signal;
a second duty cycle adjusting cell, for receiving the first output clock signal and a second duty cycle control signal to adjust duty cycle of the first output clock signal to generate a second output clock signal as the target clock signal;
a single to differential module, for generating a target differential clock signal as the target clock signal according to the second output clock signal; and
a duty cycle detecting module, for generating the first duty cycle control signal according to the first output clock signal and the second output clock signal, comprising:
a duty cycle difference detecting module, for generating detecting currents according to duty cycle difference between the target differential clock signal; and
a voltage generating module, for generating the first duty control signal and the second duty control signal according to the detecting currents.

21. The duty cycle controlling circuit of claim 20, wherein the duty cycle detecting module does not directly refers the first output clock signal to generate the first duty cycle control signal and the second duty cycle control signal.

22. A duty cycle detecting circuit, for generating output voltages according to the duty cycles of a first clock signal and a second clock signal, comprising:
a duty cycle difference detecting module, for generating detecting currents according to duty cycle difference between the first clock signal and the second clock signal; and
a voltage generating module, for generating the output voltages according to the detecting currents, comprising balanced current mirrors to generate the output voltages according to the detecting currents.

23. A duty cycle detecting circuit, for generating output voltages according to the duty cycles of a first clock signal and a second clock signal, comprising:
a duty cycle difference detecting module, for generating detecting currents according to duty cycle difference between the first clock signal and the second clock signal; and
a voltage generating module, for generating the output voltages according to the detecting currents;
wherein the duty cycle difference detecting module comprises:
a first type-two transistor, having a first terminal and a second terminal, and having a control terminal coupled to the second terminal;
a second type-two transistor, having a first terminal coupled to the second terminal of the first type-two transistor, and having a control terminal and a second terminal;
a third type-two transistor, having a first terminal and a second terminal, and having a control terminal coupled to the second terminal of the third type-two transistor;

a fourth type-two transistor, having a first terminal coupled to the second terminal of the third type-two transistor, and having a control terminal and a second terminal;

a first type-one transistor, having a first terminal coupled the second terminal of the first type-two transistor and the first terminal of the second type-two transistor, having a control terminal receiving the second clock signal, and having a second terminal coupled to the second terminal of the second type-two transistor;

a second type-one transistor, having a first terminal coupled the second terminal of the third type-two transistor and the first terminal of the fourth type-two transistor, having a control terminal receiving the first clock signal, and having a second terminal coupled to the second terminal of the fourth type-two transistor;

a first inverter, having an input terminal coupled to the control terminal of the fourth type-two transistor and the control terminal of the first type-one transistor, and having an output terminal coupled to the control terminal of the second type-two transistor and the control terminal of the second type-one transistor;

a second inverter, having an input terminal coupled to the output terminal of the first inverter, and having an output terminal coupled to the input terminal of the first inverter;

a third type-one transistor, having a first terminal coupled to the second terminals of the first type-one transistor and the second type-one transistor;

a fourth type-one transistor, having a first terminal coupled to the second terminals of the third type-one transistor, having a control terminal receiving an enable signal for turning on or turning off the duty cycle difference detecting module, and having a second terminal; and wherein the duty cycle difference detecting module outputting detecting currents at the control terminals of the first type-two transistor and the second type-two transistor.

24. A duty cycle detecting circuit, for generating output voltages according to the duty cycles of a first clock signal and a second clock signal, comprising:

a duty cycle difference detecting module, for generating detecting currents according to duty cycle difference between the first clock signal and the second clock signal; and a voltage generating module, for generating the output voltages according to the detecting currents;

wherein the detecting currents comprise a first detecting current and a second detecting current, where the duty cycle difference detecting module receives an enable signal to turn on or turn off the duty cycle difference detecting module, wherein the voltage generating module comprises:

a first type-two transistor, having a first terminal coupled to a first predetermined voltage level, having a control terminal receiving the enable signal, and having a second terminal;

a second type-two transistor, having a first terminal coupled to the first predetermined voltage level, having a control terminal receiving the enable signal, and having a second terminal;

a third type-two transistor, having a first terminal coupled to the first predetermined voltage level, having a control terminal coupled to the second terminal of the first type-two transistor and receiving the second detecting current, and having a second terminal;

a fourth type-two transistor, having a first terminal coupled to the first predetermined voltage level, having a control terminal coupled to the second terminal of the second type-two transistor and receiving the first detecting current, and having a second terminal;

a fifth type-two transistor, having a first terminal coupled to the first predetermined voltage level, having a control terminal coupled to the second terminal of the first type-two transistor and receiving the second detecting current, and having a second terminal;

a sixth type-two transistor, having a first terminal coupled to the first predetermined voltage level, having a control terminal coupled to the second terminal of the second type-two transistor and receiving the first detecting current, and having a second terminal;

a seventh type-two transistor, having a first terminal coupled to a second predetermined voltage level, having a control terminal receiving the enable signal, and having a second terminal coupled to the second terminal of the fifth type-two transistor;

a eighth type-two transistor, having a first terminal coupled to the second predetermined voltage level, having a control terminal receiving the enable signal, and having a second terminal coupled to the second terminal of the fourth type-two transistor;

a first type-one transistor, having a first terminal coupled to a second terminal of the third type-two transistor, having a control terminal receiving an inversed signal of the enable signal, and having a second terminal coupled to a third predetermined voltage level;

a second type-one transistor, having a first terminal coupled to the first terminal of the first type-one transistor, having a control terminal coupled to the first terminals of the first type-one transistor and the second type-one transistor, and the first terminal of the second type-one transistor, and having a second terminal coupled to the third predetermined voltage level;

a third type-one transistor, having a first terminal, having a control terminal coupled to the control terminal of the second type-one transistor, and having a second terminal coupled to the third predetermined voltage level;

a fourth type-one transistor, having a first terminal and a control terminal, and having a second terminal coupled to the third predetermined voltage level;

a fifth type-one transistor, having a first terminal coupled to the second terminal of the sixth type-two transistor, having a control terminal coupled to the control terminal of the fourth type-one transistor and the first terminal of the fifth type-one transistor, and having a second terminal coupled to the third predetermined voltage level; and a sixth type-one transistor, having a first terminal coupled to the first terminal of the fifth type-one transistor, having a control terminal receiving the inversed signal of the enable signal, and having a second terminal coupled to the third predetermined voltage level;

wherein the voltage generating module outputs the output voltages at the second terminals of the fifth type-two transistor and the fourth type-two transistor.

\* \* \* \* \*